United States Patent
Zan et al.

(10) Patent No.: US 8,927,330 B2
(45) Date of Patent: Jan. 6, 2015

(54) METHODS FOR MANUFACTURING A METAL-OXIDE THIN FILM TRANSISTOR

(75) Inventors: Hsiao-Wen Zan, Hsinchu (TW); Chuang-Chuang Tsai, Hsinchu (TW); Chun-Cheng Yeh, Hsinchu (TW); Liang-Hao Chen, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 15 days.

(21) Appl. No.: 13/572,710

(22) Filed: Aug. 13, 2012

(65) Prior Publication Data
US 2013/0045567 A1 Feb. 21, 2013

Related U.S. Application Data

(60) Provisional application No. 61/525,166, filed on Aug. 18, 2011.

(30) Foreign Application Priority Data

Feb. 3, 2012 (TW) .............................. 101103544 A

(51) Int. Cl.
*H01L 21/363* (2006.01)
*H01L 29/786* (2006.01)

(52) U.S. Cl.
CPC ................................. *H01L 29/7869* (2013.01)
USPC ........ 438/104; 257/40; 257/43; 257/E21.462; 257/E29.094; 257/E51.006

(58) Field of Classification Search
USPC .............. 438/104, 158, 149, 46, 400, 85, 431
See application file for complete search history.

(56) References Cited

U.S. PATENT DOCUMENTS

| 7,982,216 | B2 | 7/2011 | Imai | |
| 2005/0196711 | A1* | 9/2005 | Shiroguchi et al. | 430/330 |
| 2009/0127551 | A1 | 5/2009 | Imai | |
| 2010/0032667 | A1 | 2/2010 | Yamazaki et al. | |
| 2010/0059746 | A1 | 3/2010 | Itai | |
| 2010/0084649 | A1 | 4/2010 | Seo et al. | |
| 2011/0031491 | A1* | 2/2011 | Yamazaki et al. | 257/43 |
| 2011/0180794 | A1* | 7/2011 | Yamazaki | 257/43 |

* cited by examiner

*Primary Examiner* — Chuong A Luu
*Assistant Examiner* — Rodolfo Fortich
(74) *Attorney, Agent, or Firm* — CKC & Partners Co., Ltd.

(57) ABSTRACT

Disclosed herein is a method for manufacturing a metal-oxide thin film transistor. The method includes the steps of: (a1) forming a gate electrode on a substrate; (a2) forming a gate insulating layer over the gate electrode; (a3) forming a metal-oxide semiconductor layer having a channel region on the gate insulating layer; (a4) forming a source electrode and a drain electrode on the metal-oxide semiconductor layer, wherein the source electrode is spaced apart from the drain electrode by a gap exposing the channel region; (a5) forming a mobility-enhancing layer on the channel region, wherein the mobility-enhancing layer is not in contact with the source electrode and the drain electrode; and (a6) annealing the metal-oxide semiconductor layer and the mobility-enhancing layer in an environment at a temperature of about 200° C. to 350° C.

13 Claims, 9 Drawing Sheets

METHODS FOR MANUFACTURING A METAL-OXIDE THIN FILM TRANSISTOR

RELATED APPLICATIONS

This application claims priority to U.S. Provisional Application Ser. No. 61/525,166, filed Aug. 18, 2011 and Taiwan Application Serial Number 101103544, filed Feb. 3, 2012, the disclosures of which are incorporated herein by reference in their entireties.

BACKGROUND

1. Technical Field

The present invention relates to a method for manufacturing a metal-oxide thin film transistor.

2. Description of Related Art

Metal-oxide thin film transistors (TFTs) are transistors utilizing metal oxide as semiconductor layers. As compared to amorphous silicon TFTs, metal-oxide TFTs possess high carrier mobility, and therefore exhibit excellent device characteristics. In addition, the method of manufacturing metal-oxide TFTs is simpler than that of low temperature polycrystalline silicon TFTs, so that metal-oxide TFTs are advantageous in having a better productivity.

In conventional methods of manufacturing metal-oxide TFTs, the device characteristics of metal-oxide TFTs are unstable when the metal-oxide semiconductor layers are not annealed. FIG. 1 is a graph showing relationships between the gate voltage and the drain current when the drain voltage is 20V, in which the same unannealed metal-oxide TFT is measured six times under identical conditions. As depicted in FIG. 1, each of the six measured results differs from the others, and the threshold voltage of the metal-oxide TFT shifts significantly. The variation of the threshold voltage is about 9.36V. In order to resolve this repeatability problem, an anneal process at a temperature of over 350° C. is unitized to improve the stability of the metal-oxide TFT. However, the metal-oxide TFT is deformed during the anneal process because of the thermal stress generated in the high-temperature anneal process.

In view of the above, there exists a need for a new method that would improve the stability of metal-oxide TFTs and lower the temperature of the anneal process.

SUMMARY

A method for manufacturing a metal-oxide thin film transistor is provided. According to one embodiment, the method includes the steps of: (a1) forming a gate electrode on a substrate; (a2) forming a gate insulating layer over the gate electrode; (a3) forming a metal-oxide semiconductor layer having a channel region on the gate insulating layer; (a4) forming a source electrode and a drain electrode on the metal-oxide semiconductor layer, wherein the source electrode is spaced apart from the drain electrode by a gap exposing the channel region; (a5) forming a mobility-enhancing layer on the channel region, wherein the mobility-enhancing layer is not in contact with the source electrode and the drain electrode; and (a6) annealing the metal-oxide semiconductor layer and the mobility-enhancing layer in an environment at a temperature of about 200° C. to 350° C.

According to another embodiment, the method includes the steps of: (b1) forming a gate electrode on a substrate; (b2) forming a gate insulating layer over the gate electrode; (b3) forming a metal-oxide semiconductor layer having a channel region on the gate insulating layer; (b4) forming a source electrode and a drain electrode on the metal-oxide semiconductor layer, wherein the source electrode is spaced apart from the drain electrode by a gap exposing the channel region; (b5) treating a surface of the channel region of the metal-oxide semiconductor layer by using a mobility-enhancing medium; and (b6) annealing the treated metal-oxide semiconductor layer in an environment at a temperature of about 200° C. to 350° C.

It is to be understood that both the foregoing general description and the following detailed description are by examples, and are intended to provide further explanation of the invention as claimed.

DETAILED DESCRIPTION

Figure 1:
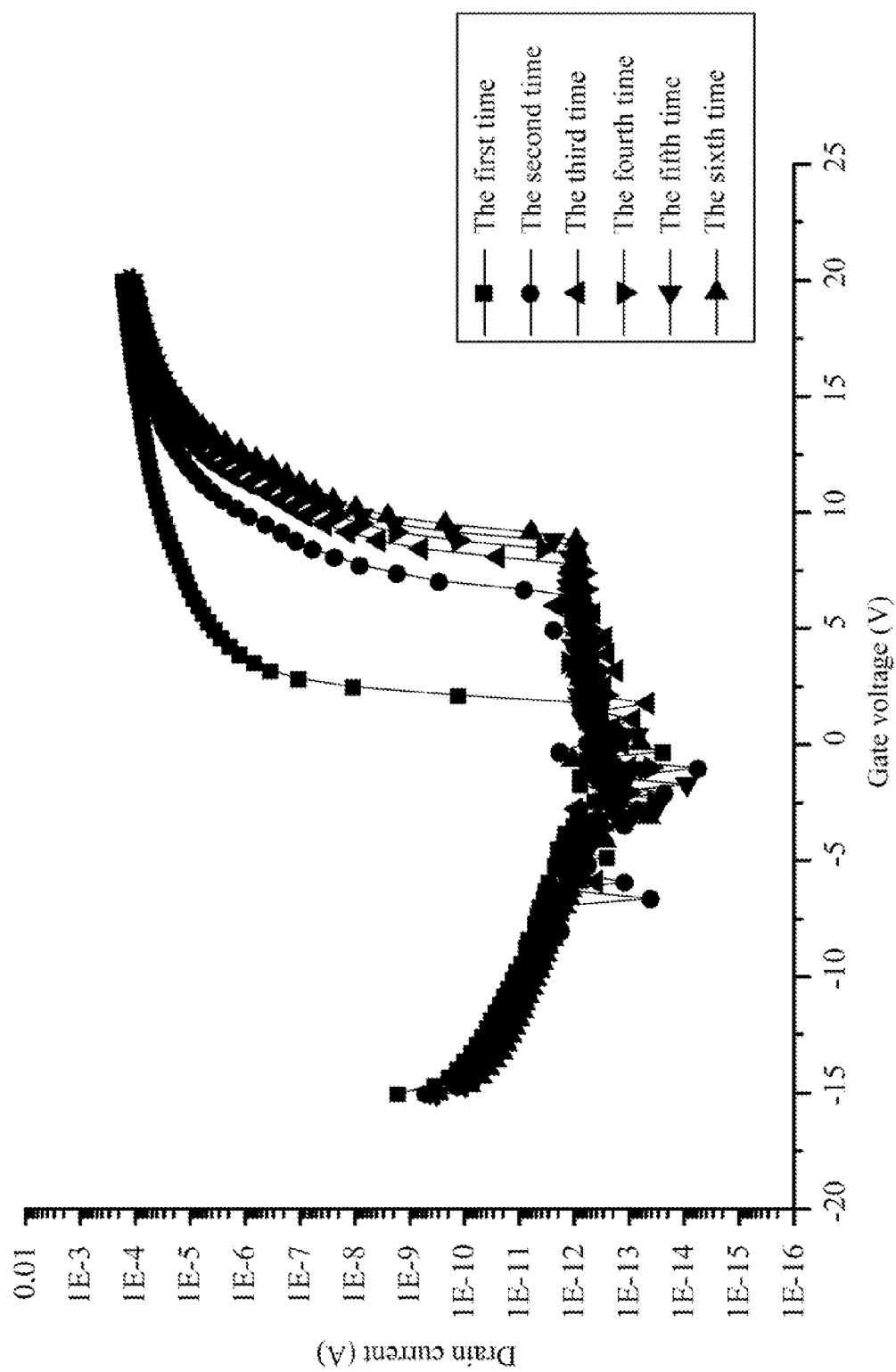
FIG. 1 is a graph showing relationships between the gate voltage and the drain current when the drain voltage is 20 V, in which the same metal-oxide TFT is measured six times under identical conditions.

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 2:
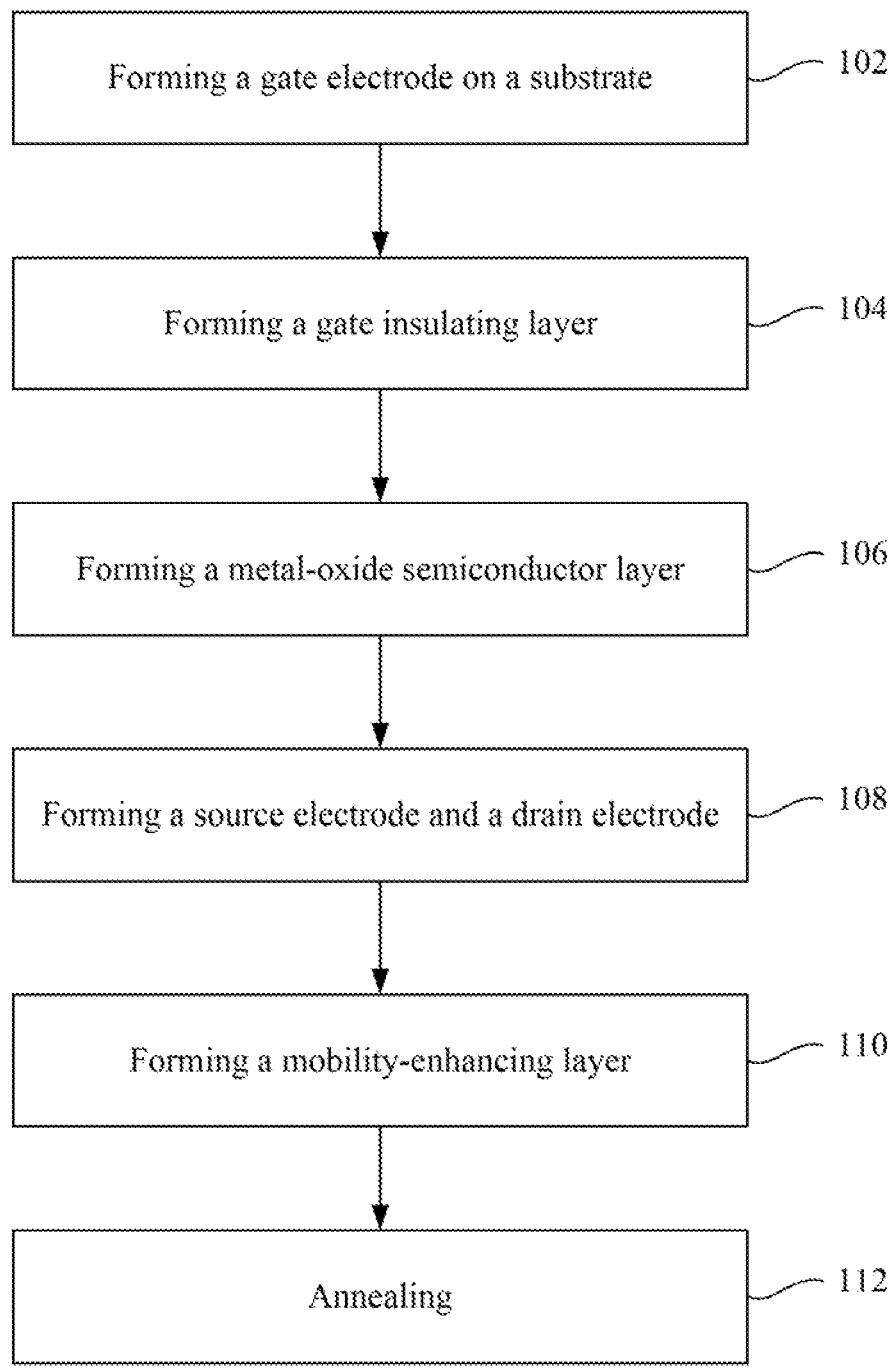
FIG. 2 is a flow chart showing a method for manufacturing a metal-oxide thin film transistor according to one embodiment of the present disclosure.

FIG. 2 is a flow chart showing a method 100 for manufacturing a metal-oxide thin film transistor according to one embodiment of the present disclosure. FIGS. 3-7 are cross-sectional views schematically illustrating process steps of the method illustrated in FIG. 2.

Figure 3:
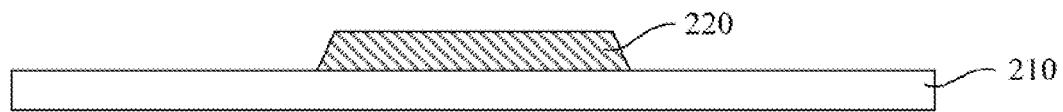
FIGS. 3-8B are cross-sectional views schematically illustrating process steps of a method for manufacturing a metal-oxide thin film transistor according to one embodiment of the present disclosure.

In step 102, a gate electrode 220 is formed on a substrate 210, as depicted in FIG. 3. The substrate 210 may be a glass substrate or a silicon substrate, for example. In one embodiment, the gate electrode 220 may be formed by direct current sputtering processes. The gate electrode 220 may be made of chromium, molybdenum, aluminum, molybdenum alloy, aluminum alloy or a combination thereof. In another embodiment, the gate electrode 220 may be made of heavily doped p-type silicon, which is known in the art.

Figure 4:
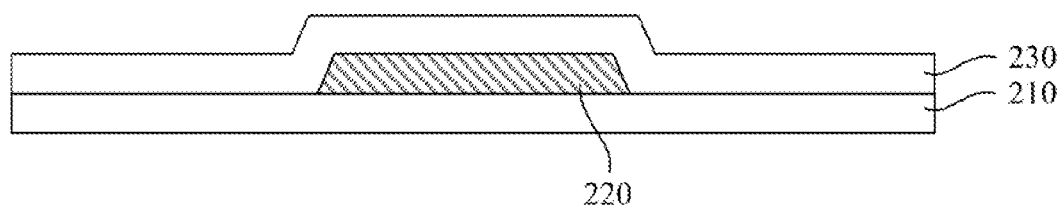

In step 104, a gate insulating layer 230 is formed over the gate electrode 220, as depicted in FIG. 4. In one embodiment, the gate insulating layer 230 may be formed by either a chemical deposition process in a horizontal furnace or a plasma-enhanced chemical vapor deposition (PECVD) process. The gate insulating layer 230 may comprise silicon nitride ($SiN_x$) or silicon oxide ($SiO_x$).

Figure 5:
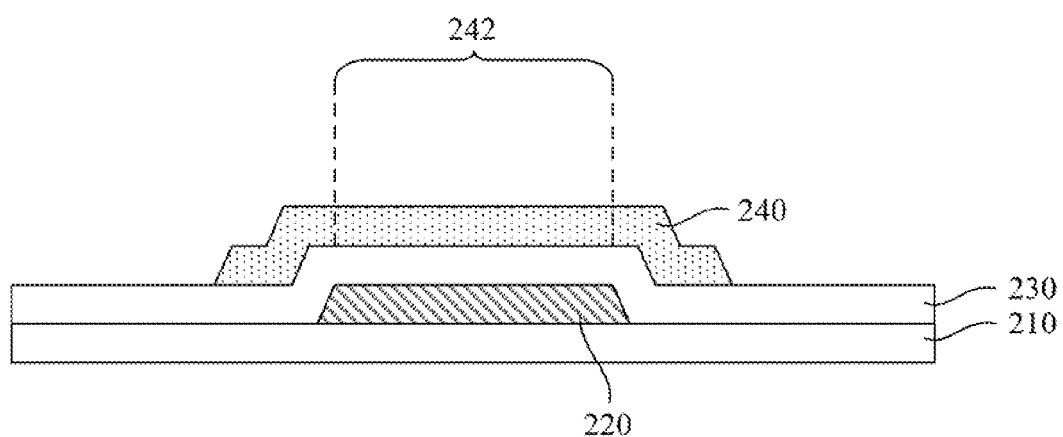

In step 106, a patterned metal-oxide semiconductor layer 240 is formed on the gate insulating layer 230, and the patterned metal-oxide semiconductor layer 240 has a channel region 242, as depicted in FIG. 5. In one embodiment, radio frequency magnetron sputtering techniques or direct current sputtering processes may be unitized to form the metal-oxide semiconductor layer 240. Suitable materials for the metal-oxide semiconductor layer 240 includes, but are limited to, amorphous indium-gallium-zinc oxide (a-IGZO), indium oxide-zinc oxide (IZO) and amorphous indium-zinc-tin-oxide (a-IZTO).

Figure 6:
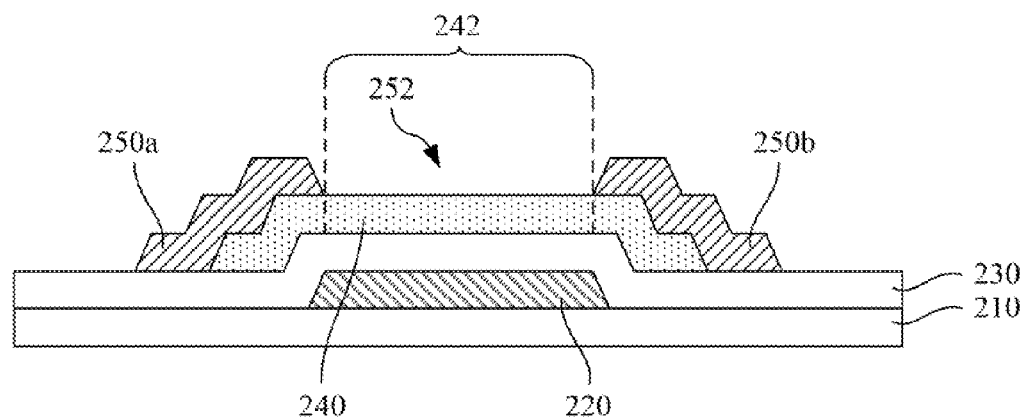

In step 108, a source electrode 250a and a drain electrode 250h are formed on the metal-oxide semiconductor layer 240, as depicted in FIG. 6. The source electrode 250a is spaced apart from the drain electrode 250b by a gap 252 that allows a channel region 242 of the metal-oxide semiconductor layer 240 to be exposed. In one embodiment, thermal evaporation processes or direct current sputtering processes may be employed to form the source electrode 250a and the drain electrode 250b. Both the source electrode 250a and the drain electrode 250b may be made of chromium, molybdenum, aluminum, molybdenum alloy, aluminum alloy or a combination thereof.

In one embodiment, after step 108 and prior to step 110, the metal-oxide semiconductor layer 240 may be thermally treated. For instance, the resultant structure of step 108, which has the source electrode 250a, the drain electrode 250b and the metal-oxide semiconductor layer 240, may be subjected to an environment at a temperature of about 200° C. to about 350° C. to thermally treat the metal-oxide semiconductor layer 240. The thermal treatment is conducted for the purpose of improving the stabilities of the metal-oxide semiconductor layer 240, which is described in detail hereinafter.

Figure 7A:
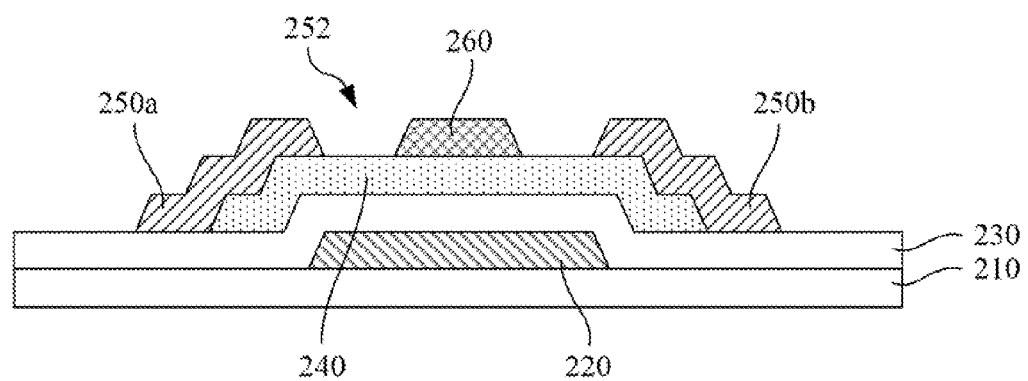

In step 110, a mobility-enhancing layer 260 is formed on the channel region 242, as depicted in FIG. 7A. The mobility-enhancing layer 260 is capable of removing the unbound oxygen or weakly bound oxygen existed in the metal-oxide semiconductor layer 240, so that the stabilities of the metal-oxide semiconductor layer 240 may be improved. Specifically, the mobility-enhancing layer 260 may comprises a material capable of chemically bonding with oxygen, such as inorganic materials, ionic compounds or covalent compounds. It is noted that the mobility-enhancing layer 260 is in contact with the metal-oxide semiconductor layer 240 such that the mobility-enhancing layer 260 may react with the oxygen in the metal-oxide semiconductor layer 240. In this way, the unbound oxygen and weakly bound oxygen originally existed in the metal-oxide semiconductor layer 240 may be removed. During the deposition of forming the metal-oxide semiconductor layer 240, some unbound oxygen atoms or weakly bound oxygen atoms occur in the metal-oxide semiconductor layer 240. The inventor of the present disclosure discovers that the presence of the unbound oxygen atoms and the weakly bound oxygen atoms is the main cause of the electrical instabilities of the metal-oxide semiconductor layer 240. Accordingly, the stabilities of the metal-oxide thin film transistor may be improved by removing these unbound oxygen atoms and weakly bound oxygen atoms.

Suitable materials for the mobility-enhancing layer 260 includes, bur are not limited to, Ca, Li, K, Na, Mg, Ce, Mo, Ag, Ba, Ti, Fe, Ga, Al, Ge, Si and unsaturated oxides thereof. The unsaturated oxides may be an oxide such as AlO, which may further be oxidized to $Al_2O_3$. Other examples of the unsaturated oxide include unsaturated calcium oxide, unsaturated lithium oxide, unsaturated sodium oxide, unsaturated magnesium oxide, unsaturated cesium oxide, unsaturated molybdenum oxide and unsaturated silver oxide. In one embodiment, the mobility-enhancing layer 260 may be formed by a thermal evaporation process or a radio frequency magnetron sputtering process.

It is important that the mobility-enhancing layer 260 is not in contact with both the source electrode 250a and the drain electrode 250b. The inventor of the present disclosure discovers that even though the mobility-enhancing layer 260 is made of non-conductive material such as calcium oxide, the leakage current of the metal-oxide thin film transistor considerably increases when the mobility-enhancing layer 260 interconnects the source electrode 250a with the drain electrode 250b. The increase in the leakage current is unfavorable to the open/close characteristics of the transistor. Accordingly, one feature of the present disclosure relies on that the mobility-enhancing layer 260 is not in contact with both the source electrode 250a and the drain electrode 250b, so that the metal-oxide thin film transistor may provide excellent electrical characteristics.

Figure 7B:
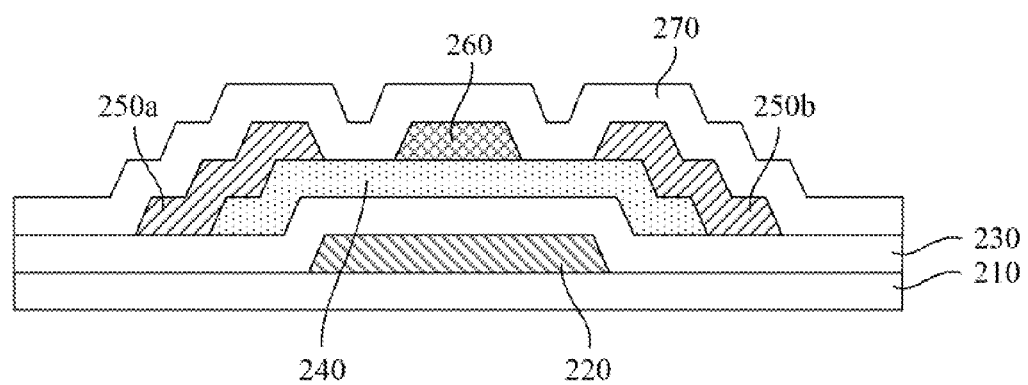

After step 110, a passivation layer 270 may optionally be formed to cover the metal-oxide semiconductor layer 240, the source/drain electrodes 250a, 250b and the mobility-enhancing layer 260, as depicted in FIG. 7B. The passivation layer 270 may protect the structure there under from deteriorations caused by oxygen and moisture.

In step 112, the metal-oxide semiconductor layer 240 and the mobility-enhancing layer 260 are annealed. The metal-oxide semiconductor layer 240 and the mobility-enhancing layer 260 are heated during the anneal process to accelerates the oxidation reaction of the mobility-enhancing layer 260, such that the metal-oxide semiconductor layer 240 reach a stable condition. In addition, since the mobility-enhancing layer 260 is formed on the metal-oxide semiconductor layer 240 to remove the unbound oxygen and weakly bound oxygen in the metal-oxide semiconductor layer 240, the obtained metal-oxide thin film transistor becomes stable even when the anneal process is performed at a temperature of below 350° C. In one embodiment, the resultant structure of step 110 is subjected to an environment at a temperature of about 200° C. to about 350° C., specifically about 200° C. to about 300° C., more specifically about 200° C. to about 250° C. The anneal process is not limited to specific approaches. Apparatus such as firing furnace, pulsed laser and UV lamp may be utilized to heat the metal-oxide semiconductor layer 240 and the mobility-enhancing layer 260.

Figure 8A:
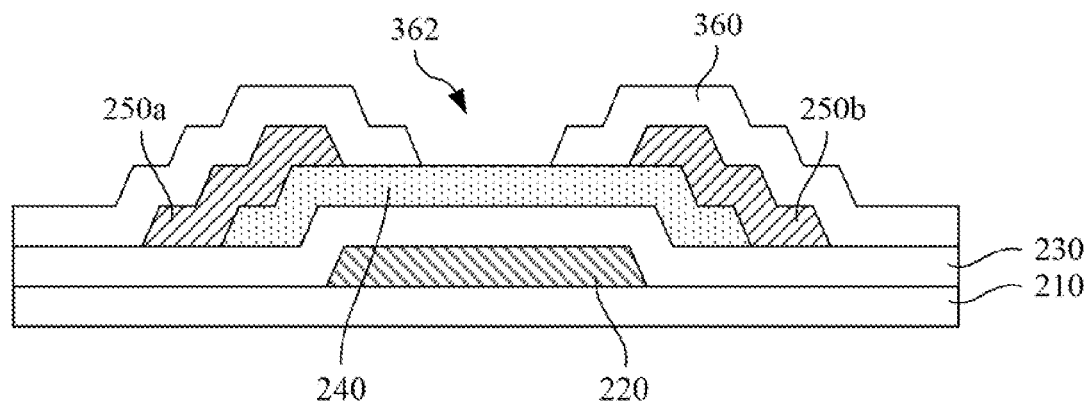
Figure 8B:
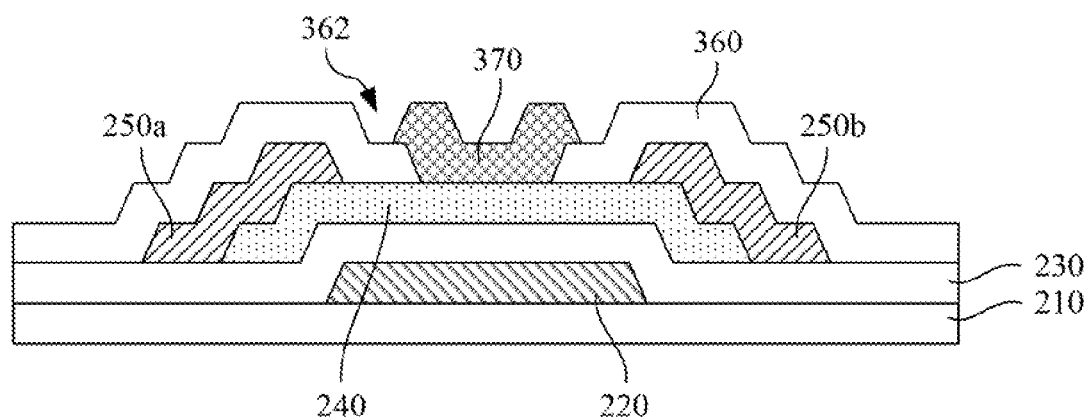

In another embodiment, after step 108 and prior to step 110, a patterned passivation layer 360 may be formed to cover the source electrode 250a and the drain electrode 250b, as depicted in FIG. 8A. The patterned passivation layer 360 has an opening 362 exposing a portion of the channel region 242. Subsequently, a mobility-enhancing layer 370 may be formed on the exposed portion of the channel region 242 in step 110, as depicted in FIG. 8B. The mobility-enhancing layer 370 is not in contact with the source/drain electrodes 250a, 250b. The features and the materials of the patterned passivation layer 360 and the mobility-enhancing layer 370 may be the same as these described hereinbefore.

Figure 9:
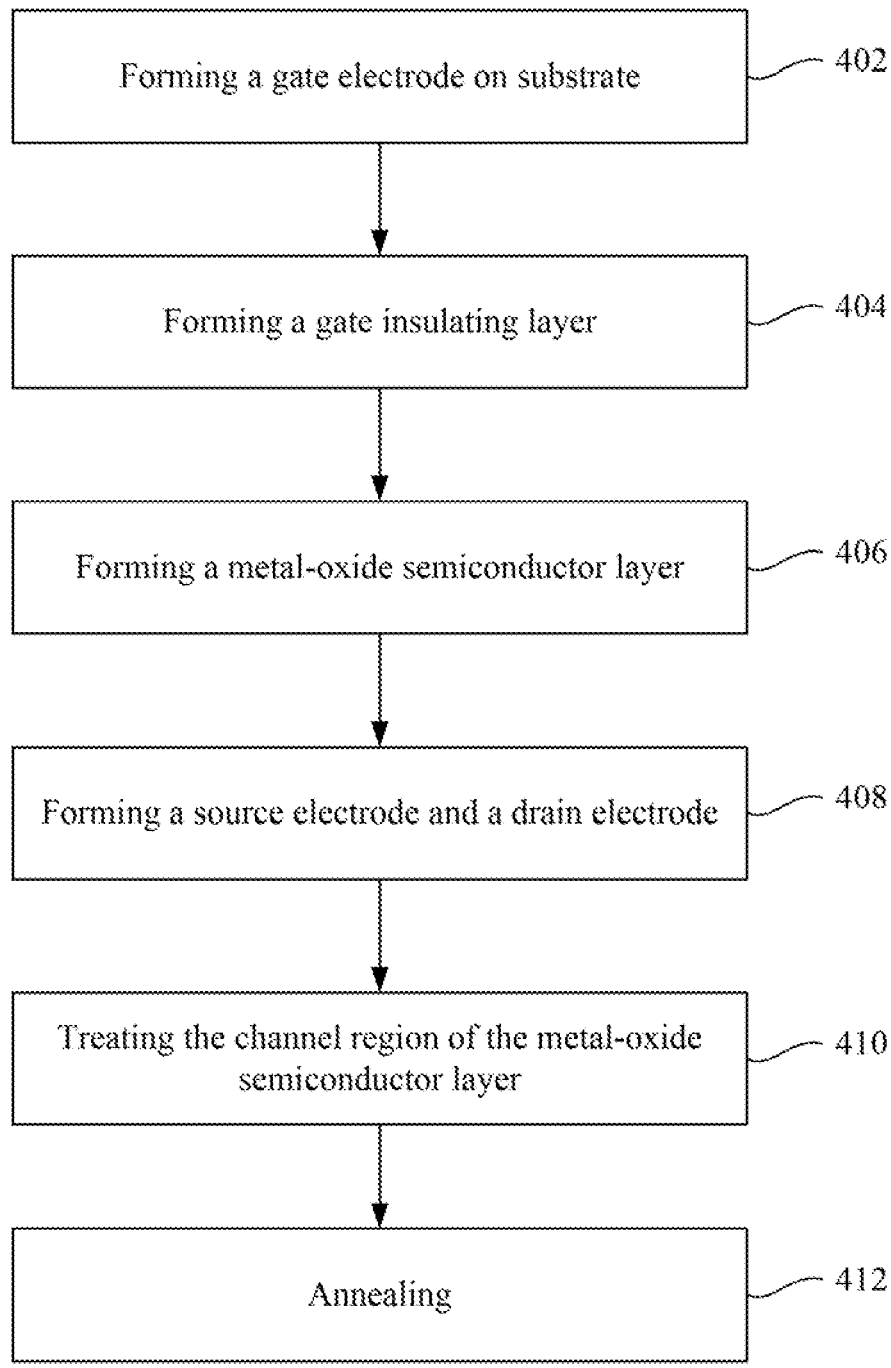
FIG. 9 is a flow chart showing a method for manufacturing a metal-oxide thin film transistor according to another embodiment of the present disclosure.

FIG. 9 is flow chart showing a method 400 for manufacturing a metal-oxide thin film transistor according to one embodiment of the present disclosure. The embodiments and features of step 402, step 404, step 406 and step 408 in method 400 may be the same as these described in step 102, step 104, step 106 and step 108 of method 100, respectively.

Figure 10A:
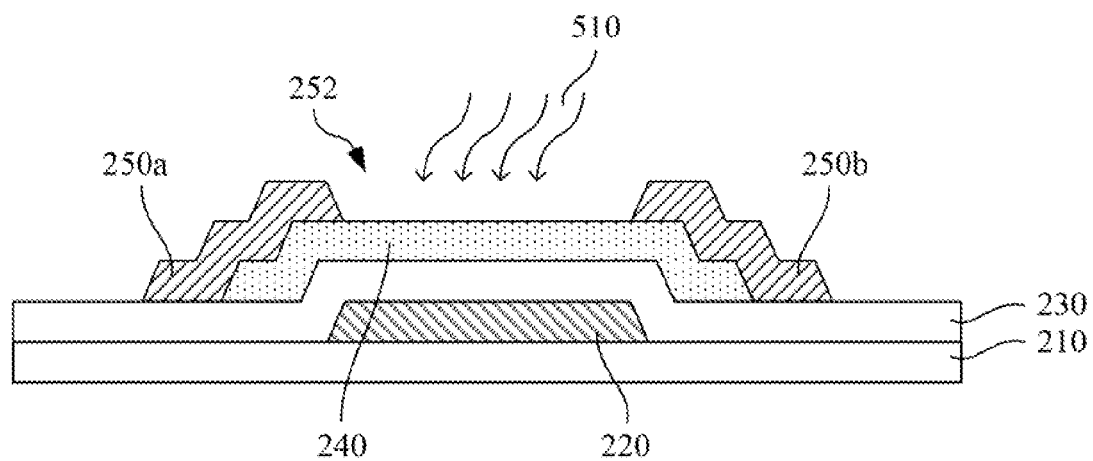
FIG. 10A and FIG. 10B are cross-sectional views schematically illustrating process steps of a method for manufacturing a metal-oxide thin film transistor according to another embodiment of the present disclosure.

In step 410, a mobility-enhancing medium 510 is provided to the channel region 242 so that a surface of the channel region 242 of the metal-oxide semiconductor layer 240 is treated by the mobility-enhancing medium 510, as depicted in FIG. 10A. The mobility-enhancing medium 510 is capable of reacting with oxygen in the metal-oxide semiconductor layer 240, and thereby the unbound oxygen atoms in the metal-oxide semiconductor layer 240 may be removed. After the surface of the channel region 242 is treated by the mobility-enhancing medium 510, there does not exist any additional film on the metal-oxide semiconductor layer 240. That is, the treatment using the mobility-enhancing medium 510 does not lead to any additional film formed on the channel region 242. The mobility-enhancing medium 510 may be a liquid or gas that is capable of chemically bonding with oxygen. In one embodiment, the mobility-enhancing medium 510 may be an organic substance such as 2-methylpentane, 2,2-dimethylbutane, tert-butanol and benzene. In another embodiment, the mobility-enhancing medium 510 may be gas such as carbon monoxide and hydrogen gas.

In step 412, the treated metal-oxide semiconductor layer 240 is annealed. The metal-oxide semiconductor layer 240 is heated during the anneal process. The embodiments of step 412 may be the same as these described in step 112.

Figure 10B:
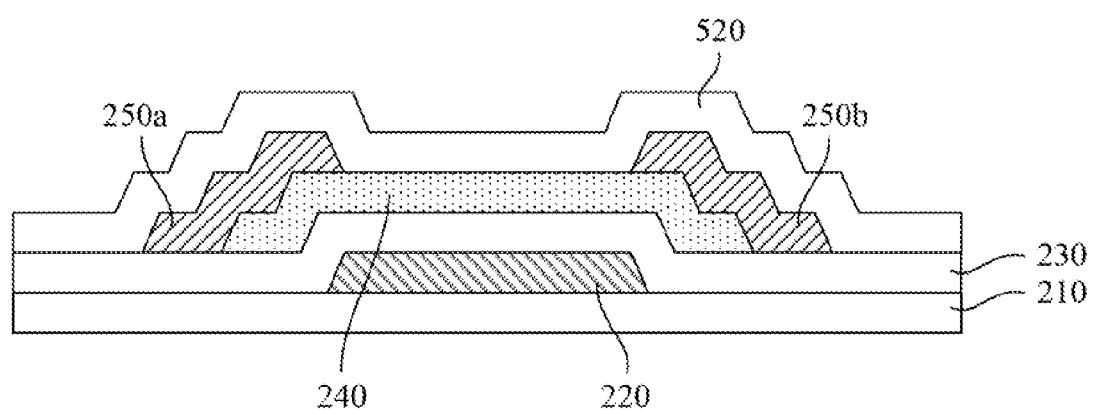

After step 412, a passivation layer 520 may optionally be formed to cover the source/drain electrodes 250a, 250b and the metal-oxide semiconductor layer 240, as depicted in FIG. 10B. The embodiments of the passivation layer 520 may be the same as these described hereinbefore. In one embodiment, the passivation layer 520 may be formed after step 410 but prior to step 412.

Figure 11:
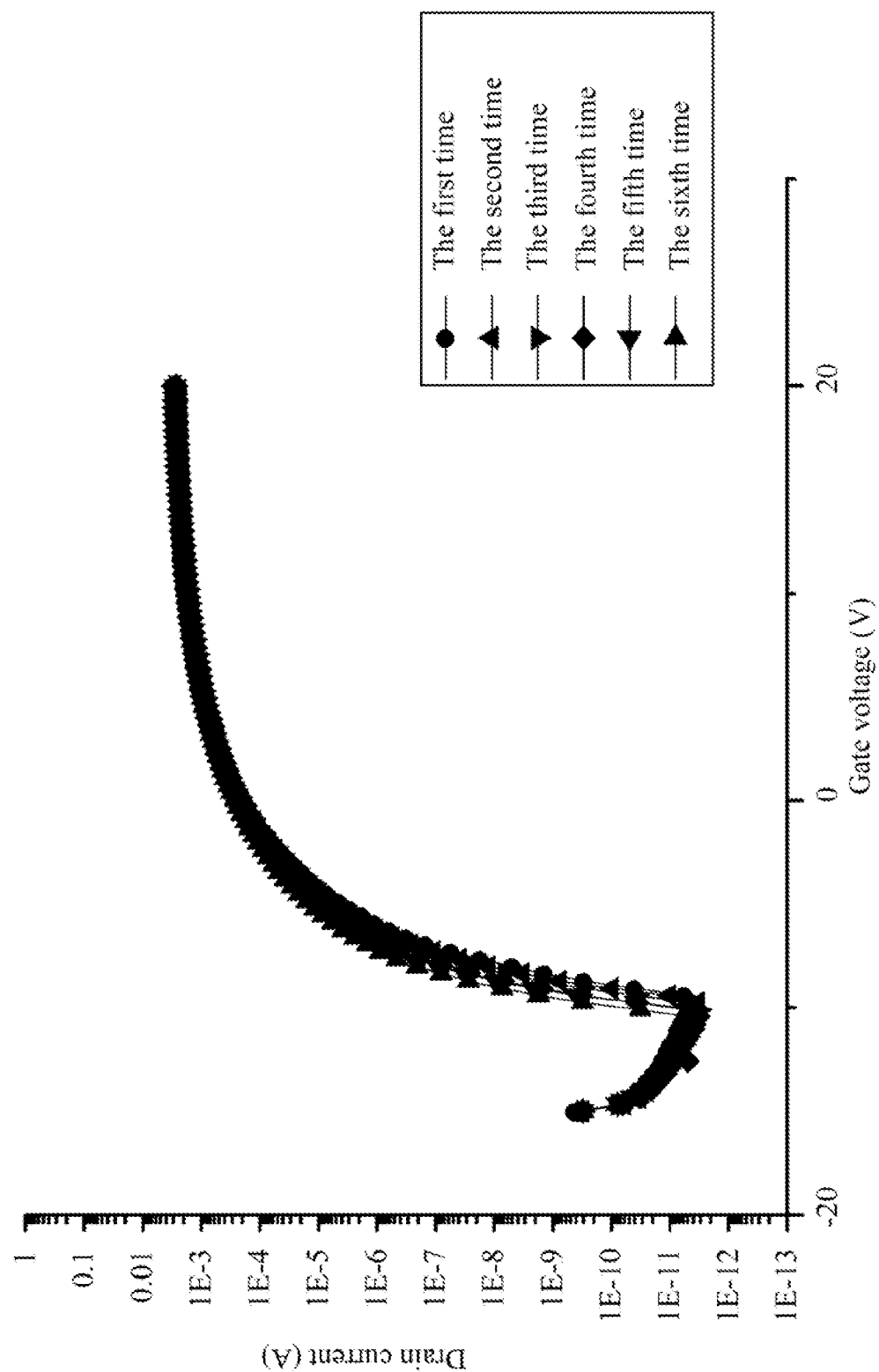
FIG. 11 is a graph showing the relationship between the gate voltage and the drain voltage of a metal-oxide thin film transistor according to one embodiment of the present disclosure.

FIG. 11 is a graph showing the relationship between the gate voltage and the drain voltage of a metal-oxide thin film transistor according to one embodiment of the present disclosure. FIG. 11 shows six measured results for the same metal-oxide thin film transistor under an identical condition, in which the drain voltage is 20V. As shown in FIG. 11, the result exhibits an excellent repeatability, and the variation of the threshold voltage is only 0.9V. This means that the stability of the metal-oxide thin film transistor is considerably increased.

Figure 12:
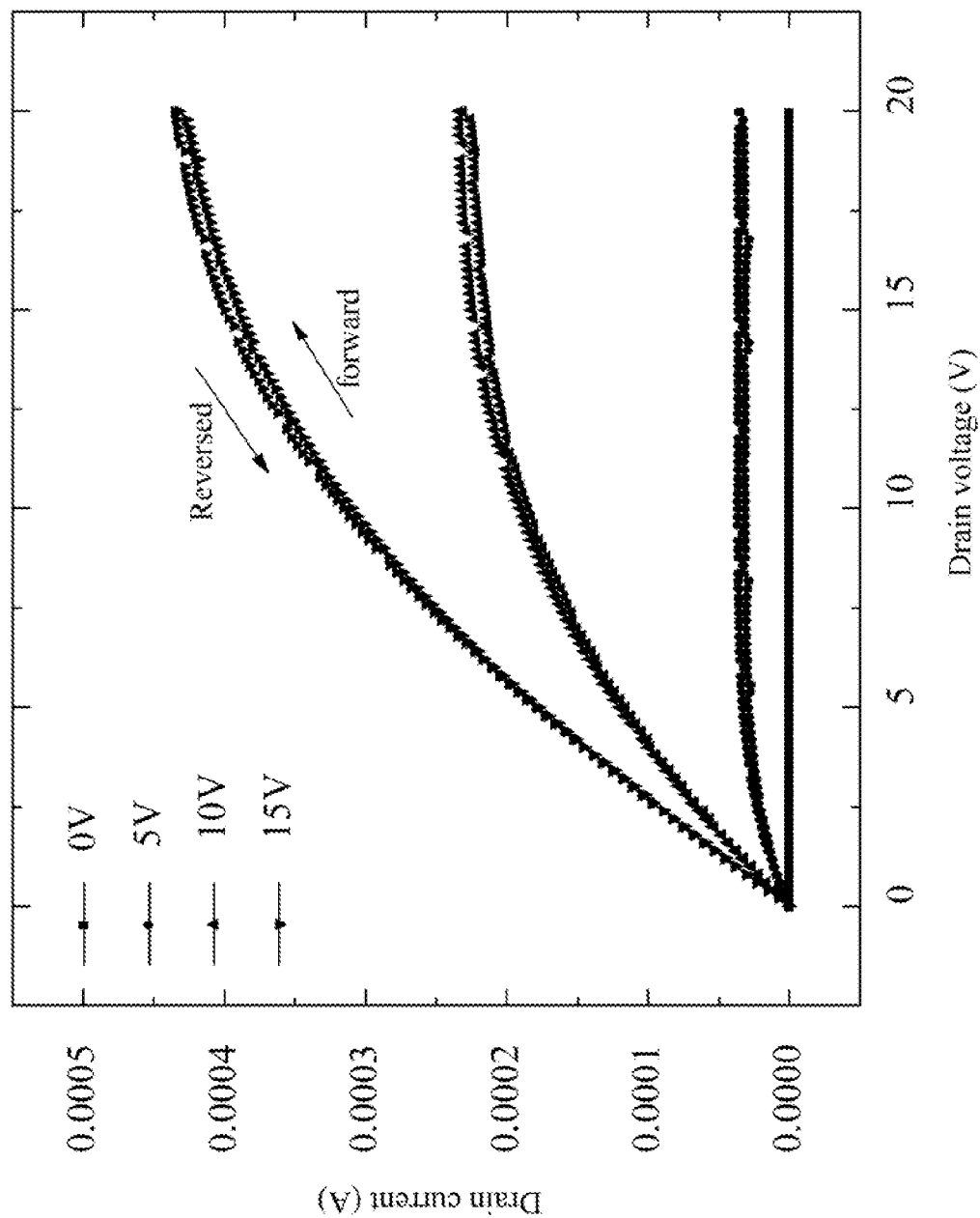
FIG. 12 is graph showing the relationship between the drain current and the drain voltage of a metal-oxide thin film transistor according to one embodiment of the present disclosure.

FIG. 12 is graph showing the relationship between the drain current ($I_D$) and the drain voltage ($V_D$) of a metal-oxide thin film transistor according to one embodiment of the present disclosure, in which the gate voltage varies is respectively 0V, 5V, 10V and 15V. In FIG. 12, both the forward path and the reversed path of each $V_D$–$I_D$ curve are shown. As illustrated in FIG. 12, the forward path of each $V_D$–$I_D$ curve almost overlaps the reversed path thereof. The metal-oxide thin film transistor exhibits stable electrical characteristics.

In the prior, it requires a process temperature of greater than 350° C. to manufacture a metal-oxide thin film transistor having stable electrical characteristics. However, the metal-oxide thin film transistor is deformed during the anneal process because of the thermal stress generated in the high-temperature anneal process. According to the embodiments of the present disclosure, a stable metal-oxide thin film transistor may be manufactured at a temperature of less than 350° C. Therefore, the deformation of the metal-oxide thin film transistor may be resolved. In addition, the low temperature implies the advantage of energy saving.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a metal-oxide thin film transistor, comprising:
    forming a gate electrode on a substrate;
    forming a gate insulating layer over the gate electrode;
    forming a metal-oxide semiconductor layer having a channel region on the gate insulating layer;
    forming a source electrode and a drain electrode on the metal-oxide semiconductor layer, wherein the source electrode is spaced apart from the drain electrode by a gap exposing the channel region;
    forming a mobility-enhancing layer on the channel region, wherein the mobility-enhancing layer is not in contact with the source electrode and the drain electrode, wherein the mobility-enhancing layer comprises a material selected from the group consisting of metallic calcium (Ca), metallic lithium (Li), metallic potassium (K), metallic sodium (Na), metallic magnesium (Mg), metallic cesium (Ce), metallic molybdenum (Mo), metallic silver (Ag), metallic barium (Ba), metallic titanium (Ti), metallic iron (Fe), metallic gallium (Ga), metallic germanium (Ge), unsaturated calcium oxide, unsaturated lithium oxide, unsaturated potassium oxide, unsaturated sodium oxide, unsaturated magnesium oxide, unsaturated cesium oxide, unsaturated molybdenum oxide, unsaturated silver oxide, unsaturated barium oxide, unsaturated titanium oxide, unsaturated iron oxide, unsaturated gallium oxide, and unsaturated germanium oxide;
    annealing the metal-oxide semiconductor layer and the mobility-enhancing layer in an environment at a temperature of about 200° C. to 350° C.

2. The method according to claim 1, wherein the step of forming the metal-oxide semiconductor layer comprises performing, a radio frequency magnetron sputtering process or a direct current sputtering process.

3. The method according to claim 1, wherein the metal-oxide semiconductor layer comprises a material selected from the group consisting of amorphous indium-gallium-zinc oxide (a-IGZO), indium oxide-zinc oxide (IZO) and amorphous indium-zinc-tin-oxide (a-IZTO).

4. The method according to claim 1, wherein the step of forming the mobility-enhancing layer comprises performing a thermal evaporation process or a sputtering process.

5. The method according to claim 1, wherein the mobility-enhancing layer comprises any of inorganic material, ionic compound and covalent compound that is capable of chemically bonding with oxygen.

6. The method according to claim 1, wherein the mobility-enhancing layer consists essentially of a material selected from the group consisting of Ba, Ca, Ti, Fe, Ga, Mg, Ge and an unsaturated oxide thereof.

7. The method according to claim 1, after the step of forming the source electrode and the drain electrode, further comprising forming a patterned passivation layer to cover the source electrode and the drain electrode, wherein the patterned passivation layer has an opening exposing a portion of the channel region.

8. The method according to claim 1, after the step of forming the mobility-enhancing layer, further comprising forming a patterned passivation layer to cover the source electrode, the drain electrode, the metal-oxide semiconductor layer and the mobility-enhancing layer.

9. The method according to claim 1, prior to the step of forming the mobility-enhancing layer, further comprising thermal treating the metal-oxide semiconductor layer in an environment at a temperature of about 200° C. to about 350° C.

10. The method according to claim 1, wherein the temperature of the annealing step ranges from about 200° C. to about 250° C.

11. A method for manufacturing a metal-oxide thin film transistor, comprising:
    forming a gate electrode on a substrate;
    forming a gate insulating layer over the gate electrode;
    forming a metal-oxide semiconductor layer having as channel region on the gate insulating layer;
    forming a source electrode and a drain electrode on the metal-oxide semiconductor layer, wherein the source electrode is spaced apart from the drain electrode by a gap exposing the channel region;
    contacting a surface of the channel region of the metal-oxide semiconductor layer with a mobility-enhancing medium comprising at least one material selected from the group consisting of 2-methylpentane, 2,2-dimethylbuta tert-butanol, benzene, carbon monoxide and hydrogen gas; and
    annealing the treated metal-oxide semiconductor layer in an environment at a temperature of about 200° C. to 350° C.

12. The method according to claim 11, after the step of treating the surface of the channel region, further comprising forming a passivation layer to cover the source electrode, the drain electrode and the metal-oxide semiconductor layer.

13. The method according to claim 11, wherein the temperature of the annealing step ranges from about 200° C. to about 250° C.

* * * * *